(12) United States Patent
Lichtenwalner et al.

(10) Patent No.: US 11,164,813 B2
(45) Date of Patent: Nov. 2, 2021

(54) TRANSISTOR SEMICONDUCTOR DIE WITH INCREASED ACTIVE AREA

(71) Applicant: Cree, Inc., Durham, NC (US)

(72) Inventors: Daniel Jenner Lichtenwalner, Raleigh, NC (US); Edward Robert Van Brunt, Raleigh, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 16/381,629

(22) Filed: Apr. 11, 2019

(65) Prior Publication Data
US 2020/0328150 A1    Oct. 15, 2020

(51) Int. Cl.
| | |
|---|---|
| *H01L 23/522* | (2006.01) |
| *H01L 23/532* | (2006.01) |
| *H01L 29/06* | (2006.01) |
| *H01L 29/16* | (2006.01) |
| *H01L 29/732* | (2006.01) |

(Continued)

(52) U.S. Cl.
CPC ...... *H01L 23/5226* (2013.01); *H01L 23/5329* (2013.01); *H01L 29/0607* (2013.01); *H01L 29/1608* (2013.01); *H01L 29/732* (2013.01); *H01L 29/7395* (2013.01); *H01L 29/7802* (2013.01); *H01L 29/7816* (2013.01)

(58) Field of Classification Search
CPC .............. H01L 29/407; H01L 29/7813; H01L 29/1095; H01L 29/7811; H01L 29/7831; H01L 29/732; H01L 23/5226
See application file for complete search history.

(56) References Cited

U.S. PATENT DOCUMENTS

| | | | |
|---|---|---|---|
| 5,726,472 A | 3/1998 | Higashida | |
| 7,537,970 B2 * | 5/2009 | Robb | ............... H01L 21/823487 257/E29.215 |

(Continued)

FOREIGN PATENT DOCUMENTS

| | | |
|---|---|---|
| DE | 10155373 A1 | 5/2003 |
| WO | 2014137622 A1 | 9/2014 |

OTHER PUBLICATIONS

International Search Report and Written Opinion for International Patent Application No. PCT/US2020/027153, dated Jul. 21, 2020, 21 pages.

*Primary Examiner* — Zandra V Smith
*Assistant Examiner* — John M Parker
(74) *Attorney, Agent, or Firm* — Withrow & Terranova, PLLC

(57) ABSTRACT

A transistor semiconductor die includes a drift layer, a first dielectric layer, a first metallization layer, a second dielectric layer, a second metallization layer, a first plurality of electrodes, and a second plurality of electrodes. The first dielectric layer is over the drift layer. The first metallization layer is over the first dielectric layer such that at least a portion of the first metallization layer provides a first contact pad. The second dielectric layer is over the first metallization layer. The second metallization layer is over the second dielectric layer such that at least a portion of the second metallization layer provides a second contact pad and the second metallization layer at least partially overlaps the first metallization layer. The transistor semiconductor die is configured to selectively conduct current between the first contact pad and a third contact pad based on signals provided at the second contact pad.

35 Claims, 15 Drawing Sheets

(51) Int. Cl.
*H01L 29/739* (2006.01)
*H01L 29/78* (2006.01)

(56) References Cited

U.S. PATENT DOCUMENTS

| | | | |
|---|---|---|---|
| 9,324,800 B1* | 4/2016 | Ku | H01L 29/66734 |
| 2003/0136984 A1* | 7/2003 | Masuda | H01L 27/0207 |
| | | | 257/247 |
| 2006/0091480 A1* | 5/2006 | Desko | H01L 29/7835 |
| | | | 257/401 |
| 2006/0157779 A1* | 7/2006 | Kachi | H01L 29/7811 |
| | | | 257/330 |
| 2007/0029573 A1* | 2/2007 | Cheng | H01L 29/0619 |
| | | | 257/135 |
| 2008/0079079 A1 | 4/2008 | Noguchi et al. | |
| 2008/0290407 A1* | 11/2008 | Kusunoki | H01L 29/4232 |
| | | | 257/334 |
| 2012/0267711 A1 | 10/2012 | Grebs et al. | |
| 2013/0187196 A1* | 7/2013 | Kadow | H01L 29/7803 |
| | | | 257/140 |
| 2013/0228854 A1* | 9/2013 | Dix | H01L 29/41766 |
| | | | 257/329 |
| 2014/0001539 A1 | 1/2014 | Yagi et al. | |
| 2014/0217495 A1 | 8/2014 | Wutte et al. | |
| 2014/0367770 A1 | 12/2014 | Aoki et al. | |
| 2014/0374818 A1* | 12/2014 | Jin | H01L 29/7802 |
| | | | 257/329 |
| 2015/0115315 A1* | 4/2015 | Tse | H01L 29/0821 |
| | | | 257/140 |
| 2015/0115449 A1 | 4/2015 | Schaffer et al. | |
| 2017/0200822 A1* | 7/2017 | Li | H01L 29/407 |
| 2018/0183433 A1* | 6/2018 | Ojima | H01L 29/66325 |
| 2018/0233563 A1* | 8/2018 | Hiyoshi | H01L 29/1095 |
| 2018/0350900 A1* | 12/2018 | Nakamata | H01L 29/063 |
| 2019/0131443 A1* | 5/2019 | Hoshi | H01L 29/4238 |
| 2020/0026517 A1* | 1/2020 | Harrington, III | G06F 9/3806 |

* cited by examiner

TRANSISTOR SEMICONDUCTOR DIE WITH INCREASED ACTIVE AREA

FIELD OF THE DISCLOSURE

The present disclosure is related to transistor devices, and in particular to vertical transistor semiconductor die with increased active area.

BACKGROUND

Power transistor devices are used to selectively pass high currents and block high voltages. As defined herein, power transistor devices are devices configured to conduct at least 0.5 A in a forward conduction mode of operation and block at least 100 V in a blocking mode of operation. Examples of power transistor devices include field-effect transistors (FETs), metal-oxide-semiconductor field-effect transistors (MOSFETs), bipolar junction transistors (BJTs), and insulated gate bipolar junction transistors (IGBTs). Power transistor devices are provided by one or more power transistor semiconductor die. Power transistor semiconductor die are often provided as vertical transistor devices including a device region surrounded by an edge termination region. The device region is the area of the power transistor semiconductor die including one or more implants, which are electrically coupled to one or more electrodes, for providing the selective current conducting and voltage blocking capabilities of the device. The edge termination region is provided to decrease the concentration of electric fields at the edges of the power transistor semiconductor die and thus prevent breakdown at low reverse voltages. The device region forms an active portion of the power transistor semiconductor die, while the edge termination region forms an inactive portion of the power transistor semiconductor die. As defined herein, a region of a semiconductor die is "active" if it is responsible for carrying current in the device when the device is in a conduction mode (for example, first quadrant or third quadrant of operation). It is generally desirable to maximize the total active area of a power transistor semiconductor die, since total active area is directly proportional to current carrying capacity. However, due to constraints on the design of conventional power transistor semiconductor die, the portion of the device region devoted to active area is limited. Accordingly, there is a present need for power semiconductor die with increased active area in the device region thereof.

SUMMARY

In one embodiment, a transistor semiconductor die includes a drift layer, a first dielectric layer, a first metallization layer, a second dielectric layer, a second metallization layer, a first plurality of electrodes, and a second plurality of electrodes. The first dielectric layer is over the drift layer. The first metallization layer is over the first dielectric layer such that at least a portion of the first metallization layer provides a first contact pad. The second dielectric layer is over the first metallization layer. The second metallization layer is over the second dielectric layer such that at least a portion of the second metallization layer provides a second contact pad. A first plurality of electrodes is over a first plurality of regions in the drift layer and is coupled to the first metallization layer. A second plurality of electrodes is over a second plurality of regions in the drift layer and is coupled to the second metallization layer. The first plurality of regions and the second plurality of regions are configured such that the transistor semiconductor die is configured to selectively conduct current between the first contact pad and a third contact pad based on signals provided at the second contact pad. By providing the second metallization layer on the second dielectric layer, a total active area of the transistor semiconductor die may be increased.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
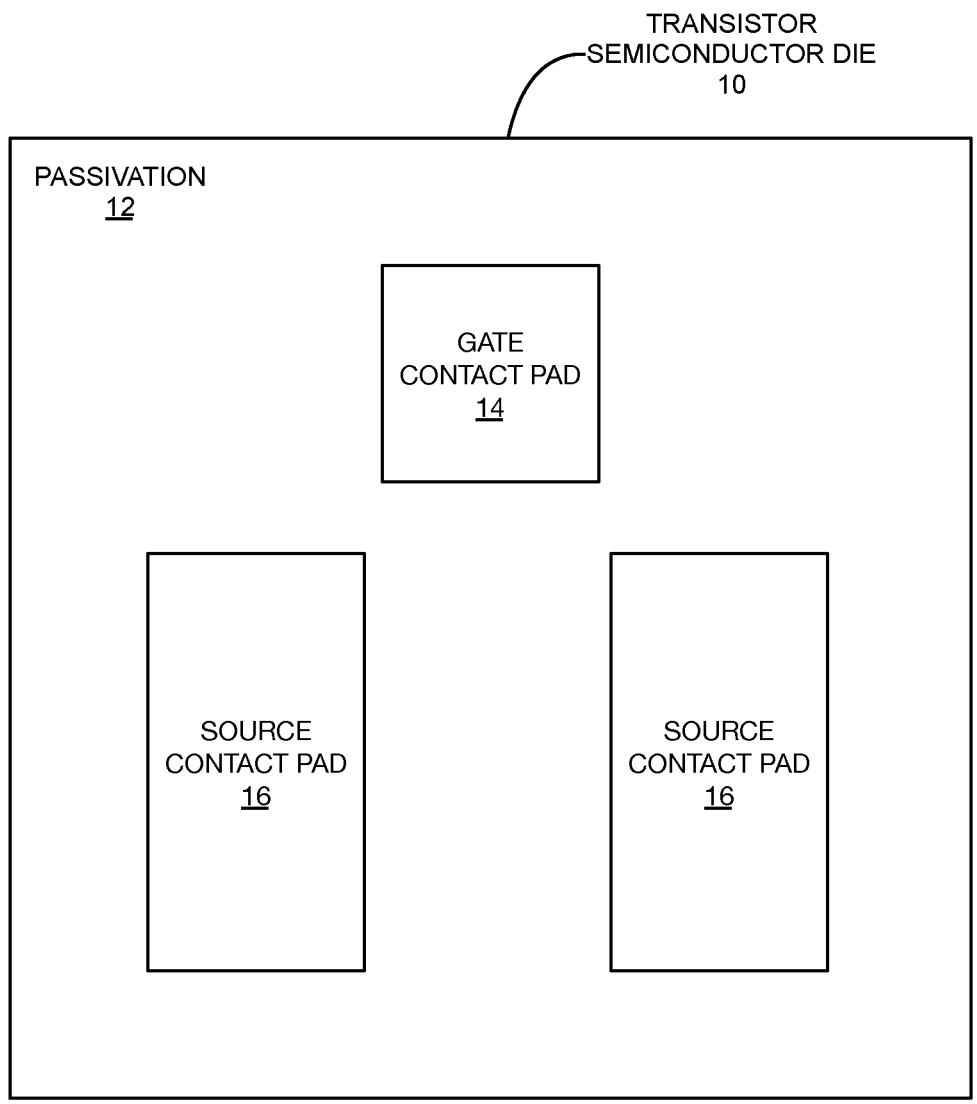
FIG. 1 is a top down view of a transistor semiconductor die according to one embodiment of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 shows a top view of a transistor semiconductor die 10 according to one embodiment of the present disclosure. For purposes of illustration, the transistor semiconductor die 10 is a vertical metal-oxide-semiconductor field-effect transistor (MOSFET) device including a passivation layer 12 with openings for a gate contact pad 14 and a number of source contact pads 16. The transistor semiconductor die 10 is a vertical power device in which a drain contact pad (not shown) is located on a backside of the device. The gate contact pad 14 and the source contact pads 16 may be provided as surfaces for coupling the transistor semiconductor die 10 to external circuitry. Accordingly, the gate contact pad 14 and the source contact pads 16 may have a minimum size so that they can be reliably connected to. In one embodiment, a minimum size of the gate contact pad 14 and each one of the source contact pads 16 is 0.4 mm$^2$. In various embodiments, a minimum size of the gate contact pad 14 and each one of the source contact pads 16 may be 0.5 mm$^2$, 0.6 mm$^2$, 0.7 mm$^2$, 0.8 mm$^2$, 0.9 mm$^2$, and up to 1.0 mm$^2$.

Figure 2:
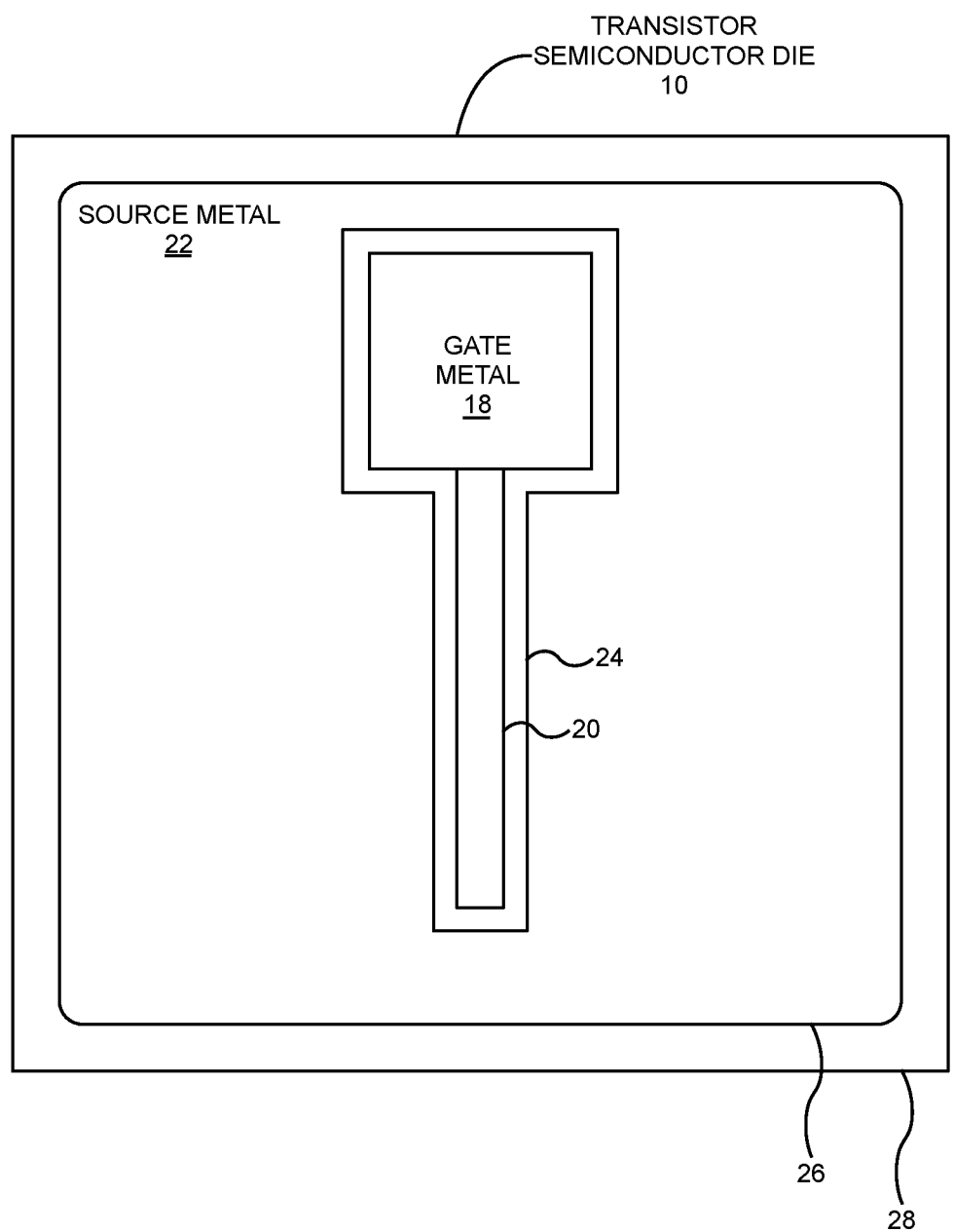
FIG. 2 is a top down view of a transistor semiconductor die according to one embodiment of the present disclosure.

FIG. 2 shows a top view of the transistor semiconductor die 10 with the passivation layer 12 removed. Underneath the passivation layer 12 is a gate metal layer 18, a gate via bar 20 coupled to the gate metal layer 18, and a source metal layer 22. As discussed in more detail below, the gate metal layer 18, the gate via bar 20, and the source metal layer 22 are provided by the same metallization layer, and thus the source metal layer 22 must include an opening 24 to accommodate the entire area of the gate metal layer 18 and the gate via bar 20 as shown. FIG. 2 also shows a device region 26 and an edge termination region 28 of the transistor semiconductor die 10. As discussed above, the device region 26 is the region of the transistor semiconductor die 10 including one or more implants, which are electrically coupled to one or more electrodes, for providing the selective current conducting and voltage blocking capabilities of the device. The edge termination region 28 is provided to decrease the concentration of electric fields at the edges of the transistor semiconductor die 10 and thus prevent breakdown at low reverse voltages.

Figure 3:
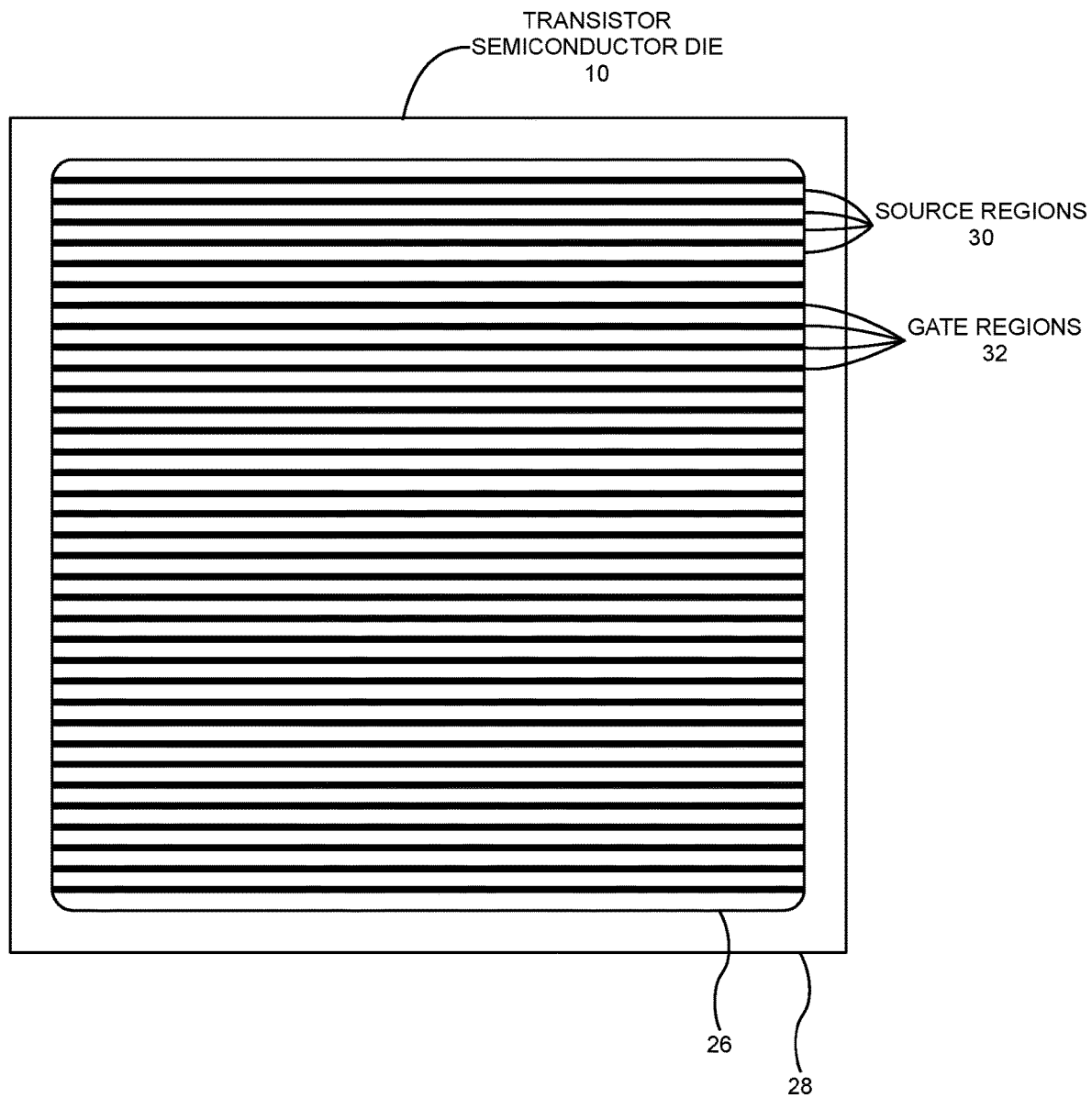
FIG. 3 is a top down view of a transistor semiconductor die according to one embodiment of the present disclosure.
Figure 4:
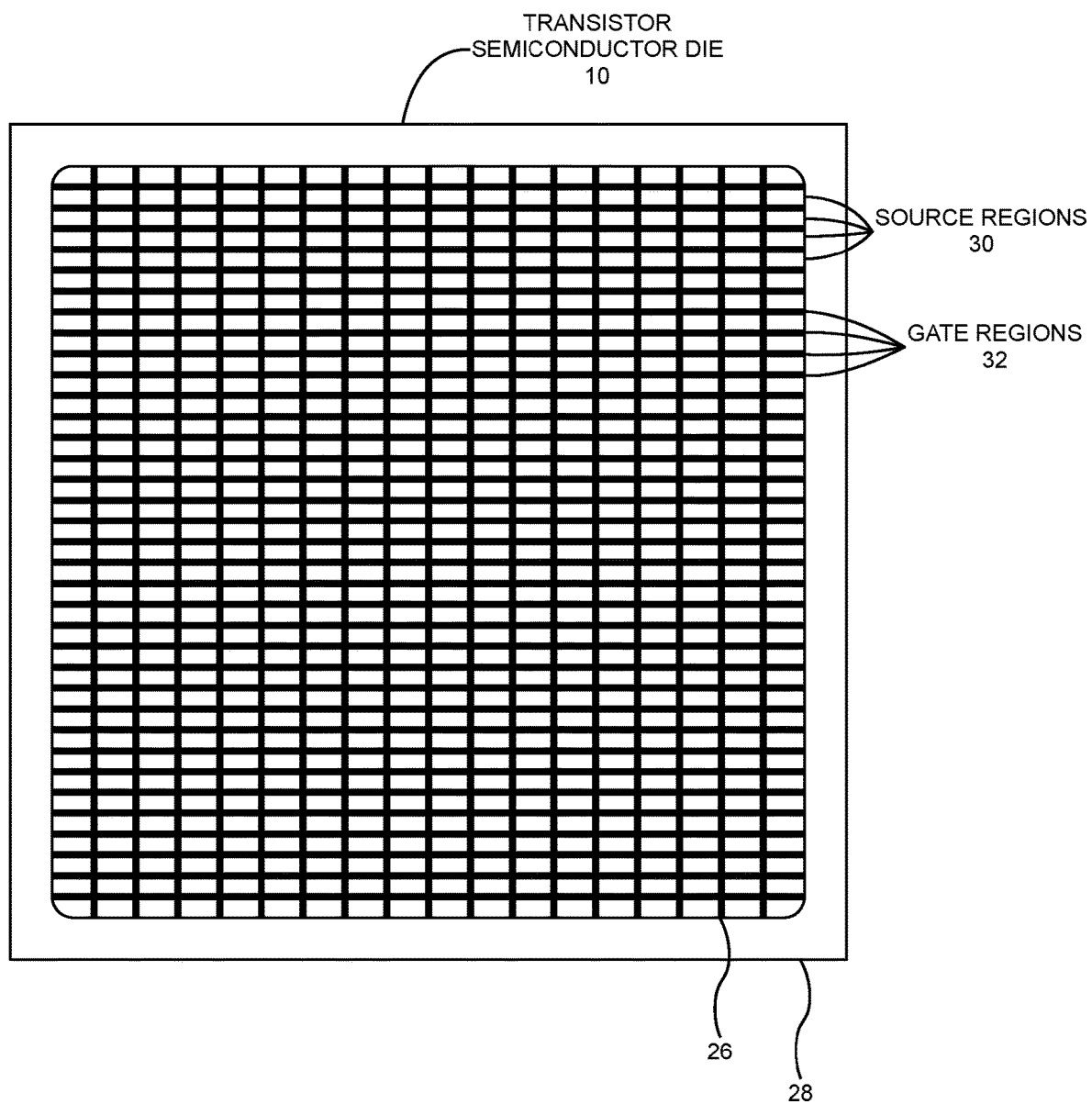
FIG. 4 is a top down view of a transistor semiconductor die according to one embodiment of the present disclosure.

FIG. 3 shows a top down view of the transistor semiconductor die 10 with the gate metal layer 18, the gate via bar 20, the source metal layer 22, and a number of other layers (discussed below) removed. Underneath these layers is a number of source regions 30 separated by a number of gate regions 32. The source regions 30 may be provided as regions having a doping type and/or doping concentration that is different than that of a drift layer in which they are located (e.g., via a separate epitaxy process from the drift layer or by implantation of the drift layer), while the gate regions 32 may be provided as regions wherein a doping type and/or doping concentration of the drift layer is relatively unchanged or changed by a different amount. As shown in FIG. 3, the gate regions 32 are provided as stripes, however, the gate regions 32 may similarly be provided in a grid as illustrated in FIG. 4. To provide the primary functionality of the transistor semiconductor die 10, the gate contact pad 14 must be in electrical contact with the gate regions 32, while the source contact pads 16 must be in electrical contact with the source regions 30.

Figure 5:
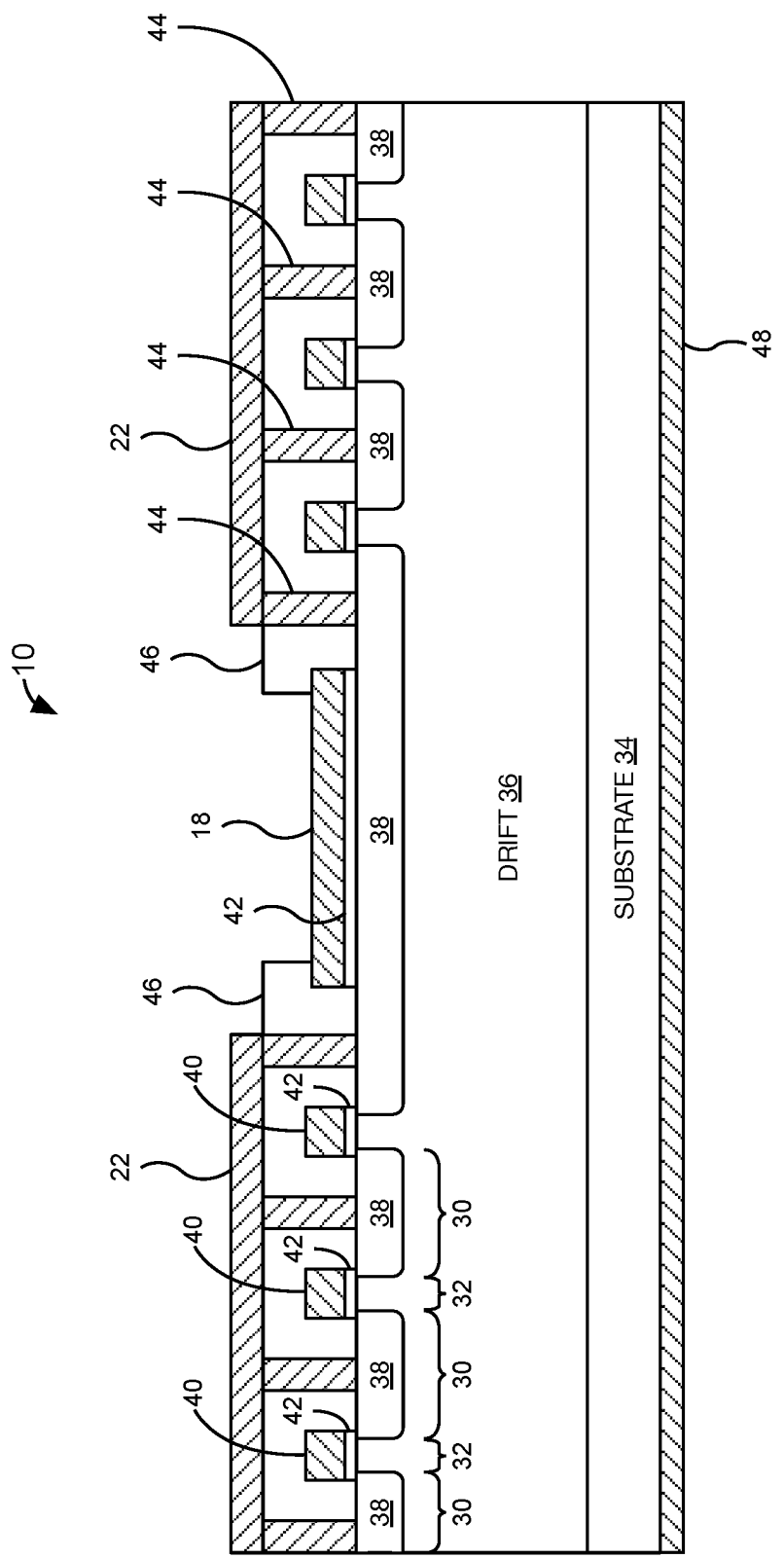
FIG. 5 is a cross-sectional view of a transistor semiconductor die according to one embodiment of the present disclosure.

FIG. 5 shows a cross-sectional view of a portion of the transistor semiconductor die 10 according to one embodiment of the present disclosure. The transistor semiconductor die 10 includes a substrate 34 and a drift layer 36 over the substrate 34. A number of implants 38 in a surface of the drift layer 36 provide the source regions 30, while a number of non-implanted regions between the implants 38 provide the gate regions 32. A number of gate electrodes 40 are provided on the gate regions 32 such that each one of the gate electrodes 40 runs between the implants 38 on either side of the gate region 32 over which they are provided. Each one of the gate electrodes 40 is separated from the surface of the drift layer 36 by an oxide layer 42. A number of source electrodes 44 are provided on the source regions 30 such that each one of the source electrodes 44 is in contact with a different one of the implants 38. The gate metal layer 18 is provided on the surface of the drift layer 36 such that the gate metal layer 18 is separated from the surface of the drift layer 36 by the oxide layer 42 and coupled to each one of the gate electrodes 40 on a plane not shown in FIG. 5. To keep the gate electrodes 40 electrically isolated from the source electrodes 44, a dielectric layer 46 is provided over the gate electrodes 40. The source electrodes 44 are exposed at a surface of the dielectric layer 46. The source metal layer 22 is provided on the dielectric layer 46 such that it is in contact with the source electrodes 44. A drain metal layer 48 is provided on the substrate 34 opposite the drift layer 36.

As shown in FIG. 2 and FIG. 5, the source metal layer 22 and the gate metal layer 18 are provided within the device region 26 of the transistor semiconductor die 10 in a single metallization step (i.e., as a single metal layer that is appropriately patterned). This means that the source metal layer 22 and the gate metal layer 18 are provided on the same surface/plane of the transistor semiconductor die 10. Accordingly, the source metal layer 22 cannot overlap with the gate metal layer 18, and instead must include an opening for the gate metal layer 18. Due to constraints on the size of the gate metal layer 18 (e.g., minimum contact pad size for wirebonding), the coverage of the source metal layer 22 is thus limited within the device region 26 of the transistor semiconductor die 10. As shown in FIG. 5, the area below the source metal layer 22 is active area in which current is carried by the drift layer 36 from the source metal layer 22 to the drain metal layer 48. The area below the gate metal layer 18 is inactive area, since current cannot be carried by the drift layer 36 below the gate metal layer 18. Accordingly, the total active area of the device region 26 and thus the total current carrying capacity of the transistor semiconductor die 10 may be limited for a given size of the die.

Figure 6:
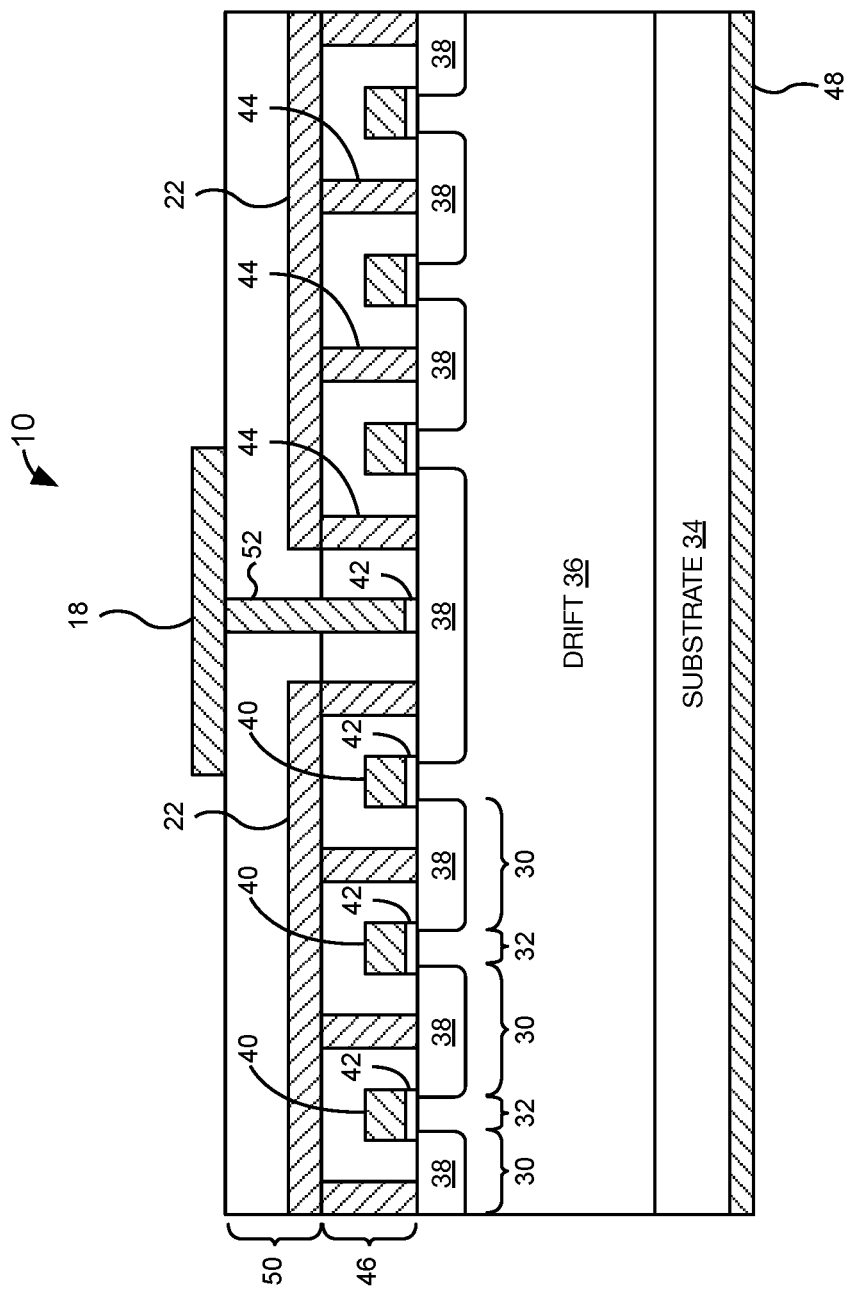
FIG. 6 is a cross-sectional view of a transistor semiconductor die according to one embodiment of the present disclosure.

Accordingly, FIG. 6 shows a cross-sectional view of the transistor semiconductor die 10 according to an additional embodiment of the present disclosure. The transistor semiconductor die 10 shown in FIG. 6 is substantially similar to that shown in FIG. 5, but further includes an additional dielectric layer 50 over the dielectric layer 46. Specifically, the gate electrodes 40 and the source electrodes 44 are provided on the surface of the drift layer 36, the dielectric layer 46 is provided over the gate electrodes 40 and the source electrodes 44 such that the gate electrodes 40 are electrically isolated from the source electrodes 44 and the source electrodes 44 are exposed at a surface of the dielectric layer 46, the source metal layer 22 is provided over the dielectric layer 46, the additional dielectric layer 50 is provided over the dielectric layer 46 and the source metal layer 22, and the gate metal layer 18 is provided over the additional dielectric layer 50. The gate metal layer 18 is electrically coupled to the gate electrodes 40 by one or more vias 52 running through the dielectric layer 46 and the additional dielectric layer 50 (connected on a plane not shown in FIG. 6). As illustrated, providing the additional dielectric layer 50 allows at least a portion of the gate metal layer 18 to overlap the source metal layer 22. The one or more vias 52 are very small in comparison to the total area of the gate metal layer 18. Accordingly, only a very small opening in the source metal layer 22 is required, and the total area covered by the source metal layer 22 is thus increased. Since, as discussed above, the area below the source metal layer 22 is active area of the transistor semiconductor die 10, this effectively increases the total active area and thus current carrying capacity of the transistor semiconductor die. In effect, a total inactive area of the device region 26 of the transistor semiconductor die 10 may be less than a total area of the gate metal layer 18, and less than a total area of the gate contact pad 14 in some embodiments, which was not previously achievable.

Increasing the active area of the transistor semiconductor die 10 allows for an increase in current carrying capacity for a given size. Alternatively, increasing the active area of the transistor semiconductor die 10 allows for a decrease in size of the die without sacrificing current carrying capacity. This in turn allows for additional chips to be provided for a given wafer when fabricating the transistor semiconductor die 10. While the examples discussed herein relate primarily to transistor semiconductor die 10 providing MOSFET devices, the principles described herein apply equally to transistor semiconductor die 10 providing field-effect transistor (FET) devices, bipolar junction transistor (BJT) devices, insulated gate bipolar transistor (IGBT) devices, or any other type of vertical transistor device with two or more top-level contacts. With this in mind, the gate contact pad 14 may be referred to generically as a first contact pad, the source contact pads 16 may be referred to generically as a second contact pad, the source metal layer 22 may be referred to generically as a first metallization layer, the gate metal layer 18 may be referred to generically as a second metallization layer, the source regions 30 may be referred to generically as a first set of regions, and the gate regions may be referred to generically as a second set of regions.

In one embodiment, the substrate 34 and the drift layer 36 are silicon carbide. Using silicon carbide for the substrate 34 and the drift layer 36 may increase the performance of the transistor semiconductor die 10 significantly when compared to using conventional material systems such as silicon. While not shown, the implants 38 may include several different implanted regions therein as necessary to provide the selective current conduction and voltage blocking capabilities of the transistor semiconductor die 10. The dielectric layer 46 and the additional dielectric layer 50 may comprise one or more layers of $Al_2O_3$ and $SiO_2$, for example, in an alternating fashion. In other embodiments, the dielectric layer 46 and the additional dielectric layer 50 may comprise one or more layers of $Si_3N_4$ and $SiO_2$, for example, in an alternating fashion. In general, the dielectric layer 46 and the additional dielectric layer 50 may comprise any suitable dielectric materials (e.g., those having a wide bandgap (>~5 eV) and a relatively low dielectric constant). The dielectric layer 46 and the additional dielectric layer 50 may comprise the same or different materials. Additional passivation layers comprising $Si_3N_4$, $Al_2O_3$, AlN, $SiO_2$, or any other suitable materials may be interleaved with the dielectric layer 46 and the additional dielectric layer 50 as necessary to avoid interactions between materials. The passivation layer 12 may comprise $Si_3N_4$, $Al_2O_3$, AlN, $SiO_2$, or any other suitable materials in various embodiments.

Figure 7B:
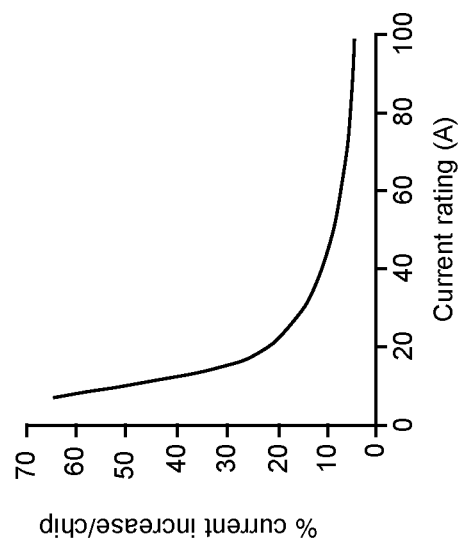
FIGS. 7A through 7C are graphs illustrating the performance of a transistor semiconductor die according to various embodiments of the present disclosure.
Figure 7C:
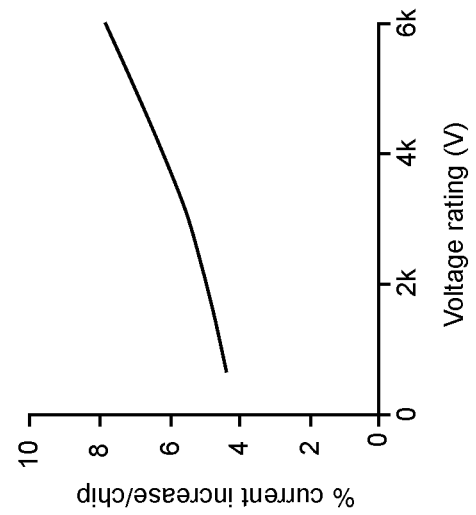
Figure 7A:
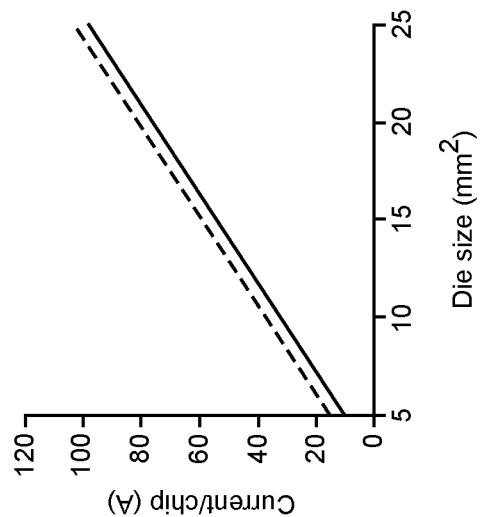

FIG. 7A is a graph illustrating the improvements in current carrying capacity to the transistor semiconductor die 10 due to the movement of the gate metal layer 18 over the source metal layer 22. A solid line illustrates a relationship between the current carrying capacity and the size of the transistor semiconductor die 10 without the improvements to the layout of the contact pads as shown in FIG. 5. A dashed line illustrates the same relationship between current carrying capacity of the transistor semiconductor die 10 with the improvements discussed above with respect to FIG. 6. The graph assumes a constant rated blocking voltage (e.g., 1200 V). As shown, an improvement in current carrying capacity of the transistor semiconductor die 10 is realized regardless of die size. As discussed above, this is due to an increase in the active area of the device region 26.

FIG. 7B is a graph further illustrating the improvements in current carrying capacity to the transistor semiconductor die 10 due to the movement of the gate metal layer 18 over the source metal layer 22. The graph illustrates a relationship between the percent increase in current carrying capacity (compared to a transistor semiconductor die without the improvements such as the one illustrated in FIG. 5) and a current rating of the transistor semiconductor die 10. As illustrated, the percentage the current capacity of the transistor semiconductor die 10 is increased has an inverse relationship with the current rating of the transistor semiconductor die 10. This is because as the current rating of the transistor semiconductor die 10 increases, so does the overall size thereof. Accordingly, the active area reclaimed as a result of the movement of the gate metal layer 18 over the source metal layer 22 makes up a smaller percentage of the total active area of the device, thereby diminishing the percentage increase in current carrying capacity seen by the use of these improvements. FIG. 7B illustrates that the largest improvements in device performance due to the improvements discussed herein are seen at lower current ratings.

FIG. 7C is a graph further illustrating the improvements in current carrying capacity to the transistor semiconductor die 10 due to the movement of the gate metal layer 18 over the source metal layer 22. The graph illustrates a relationship between the percent increase in current carrying capacity (compared to a transistor semiconductor die without the improvements such as the one illustrated in FIG. 5) and a voltage rating of the transistor semiconductor die 10. As illustrated, the percentage the current capacity of the transistor semiconductor die 10 is increased as a positive relationship with the voltage rating of the transistor semiconductor die 10. The graph shown assumes a constant size of the transistor semiconductor die 10. The relationship between the percentage increase in current carrying capacity and voltage rating is due to the fact that as the voltage rating of the transistor semiconductor die 10 increases, so does the size of the edge termination region 28. Accordingly, the size of the device region 26 decreases such that the active area reclaimed as a result of the movement of the gate metal layer 18 over the source metal layer 22 makes up a larger percentage of the total active area of the device, thereby increasing the percentage increase in current carrying capacity seen by the use of these improvements. FIG. 7C illustrates that the largest improvements in device performance for a given chip size are seen at higher voltage ratings.

Figure 8:
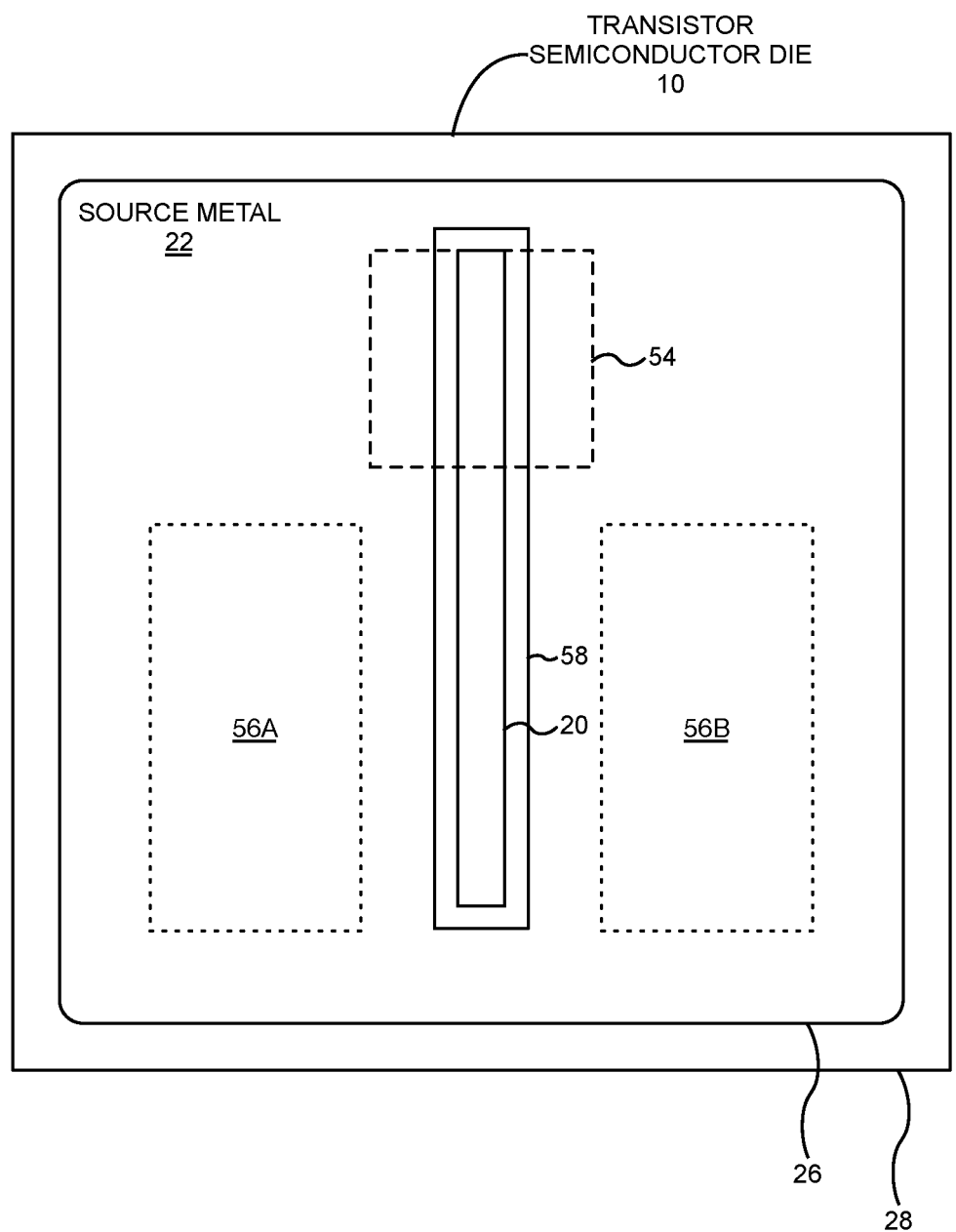
FIG. 8 is a top down view of a transistor semiconductor die according to one embodiment of the present disclosure.

FIG. 8 shows a top down view of the transistor semiconductor die 10 according to one embodiment of the present disclosure. Specifically, FIG. 8 shows the transistor semiconductor die 10 with the gate metal layer 18 and the additional dielectric layer 50 removed. Underneath the additional dielectric layer 50 the source metal layer 22 is exposed. The gate via bar 20 is still present in the embodiment shown in FIG. 8. A first dashed box 54 illustrates the area over which the gate metal layer 18 is provided. This area may correspond with the bounds of the gate contact pad 14, or may extend beyond the bounds of the gate contact pad 14. In other words, the entirety of the gate metal layer 18 may be exposed through the passivation layer 12 as the gate contact pad 14, or part of the gate metal layer 18 may be covered by the passivation layer 12 such that only a part of the gate metal layer 18 makes up the gate contact pad 14. As shown, part of the gate metal layer 18 overlays the gate via bar 20 thus allowing the gate contact pad 14 to contact the gate electrodes 40, which are coupled to the gate via bar. A second dashed box 56A and a third dashed box 56B illustrate the area of the source contact pads 16. The gate via bar 20 is still located on a surface of the drift layer 36, and thus the source metal layer 22 is still required to have an opening 58 sized to accommodate the gate via bar 20. However, the overall size of the gate via bar 20 is much smaller than that of a conventional gate contact pad. Accordingly, the size of the active area within the device region 26 of the transistor semiconductor die 10 can be significantly increased.

Figure 9:
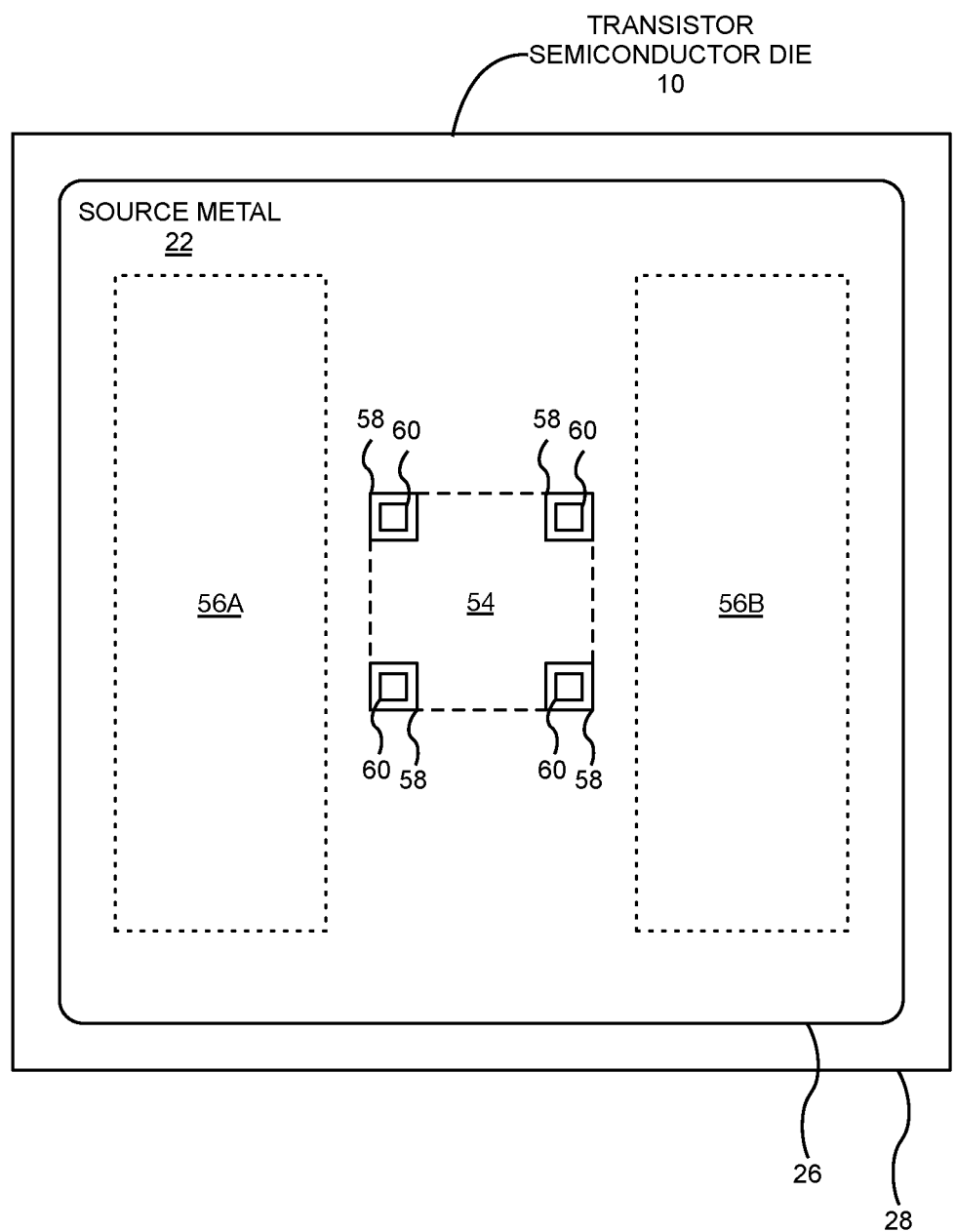
FIG. 9 is a top down view of a transistor semiconductor die according to one embodiment of the present disclosure.

FIG. 9 shows a top down view of the transistor semiconductor die 10 according to an additional embodiment of the present disclosure. Specifically, FIG. 9 shows the transistor semiconductor die 10 with the gate metal layer 18 and the additional dielectric layer 50 removed. Underneath the additional dielectric layer 50 the source metal layer 22 is exposed. The gate via bar 20 is removed in the embodiment shown in FIG. 9 and replaced with a number of gate contact vias 60, which extend through the dielectric layer 46 and the additional dielectric layer 50 to contact one or more underlying gate electrodes 40, which are in turn coupled to one another on the surface of the drift layer 36 (e.g., in a grid configuration as shown above). The first dashed box 54 illustrates the area over which the gate metal layer 18 is provided. As shown, part of the gate metal layer 18 overlays the gate contact vias 60 thus connecting the gate contact pad 14 to the gate electrodes 40. The second dashed box 56A and the third dashed box 56B illustrate the area of the source contact pads 16. The gate contact vias 60 may have an even smaller area than the gate via bar 20. Accordingly, a total size of the openings 60 in the source metal layer 22 to accommodate connections from the gate contact pad 14 to the gate electrodes 40 may be made even smaller, thereby further increasing the active area within the device region 26 of the transistor semiconductor die 10.

Figure 10:
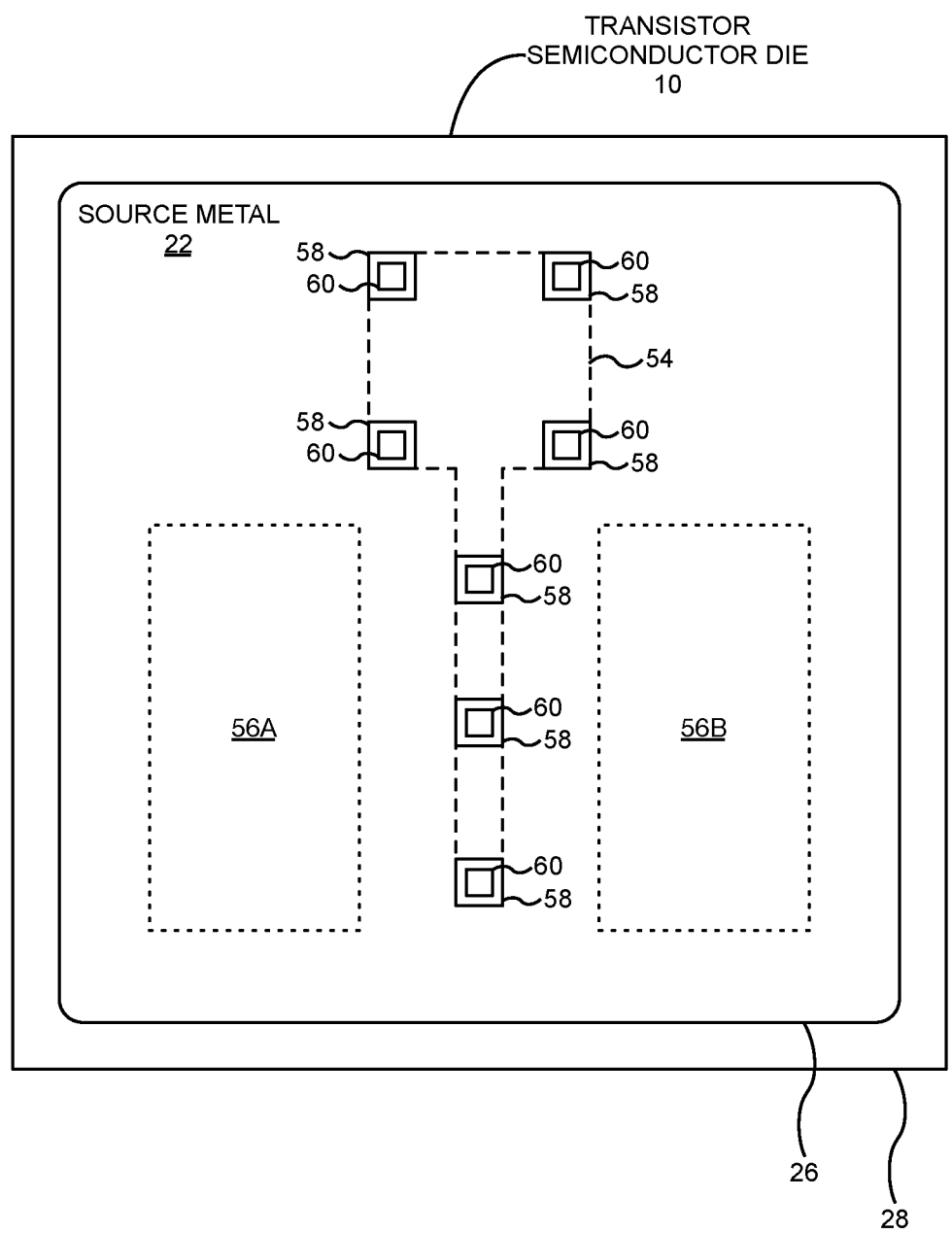
FIG. 10 is a top down view of a transistor semiconductor die according to one embodiment of the present disclosure.
Figure 11:
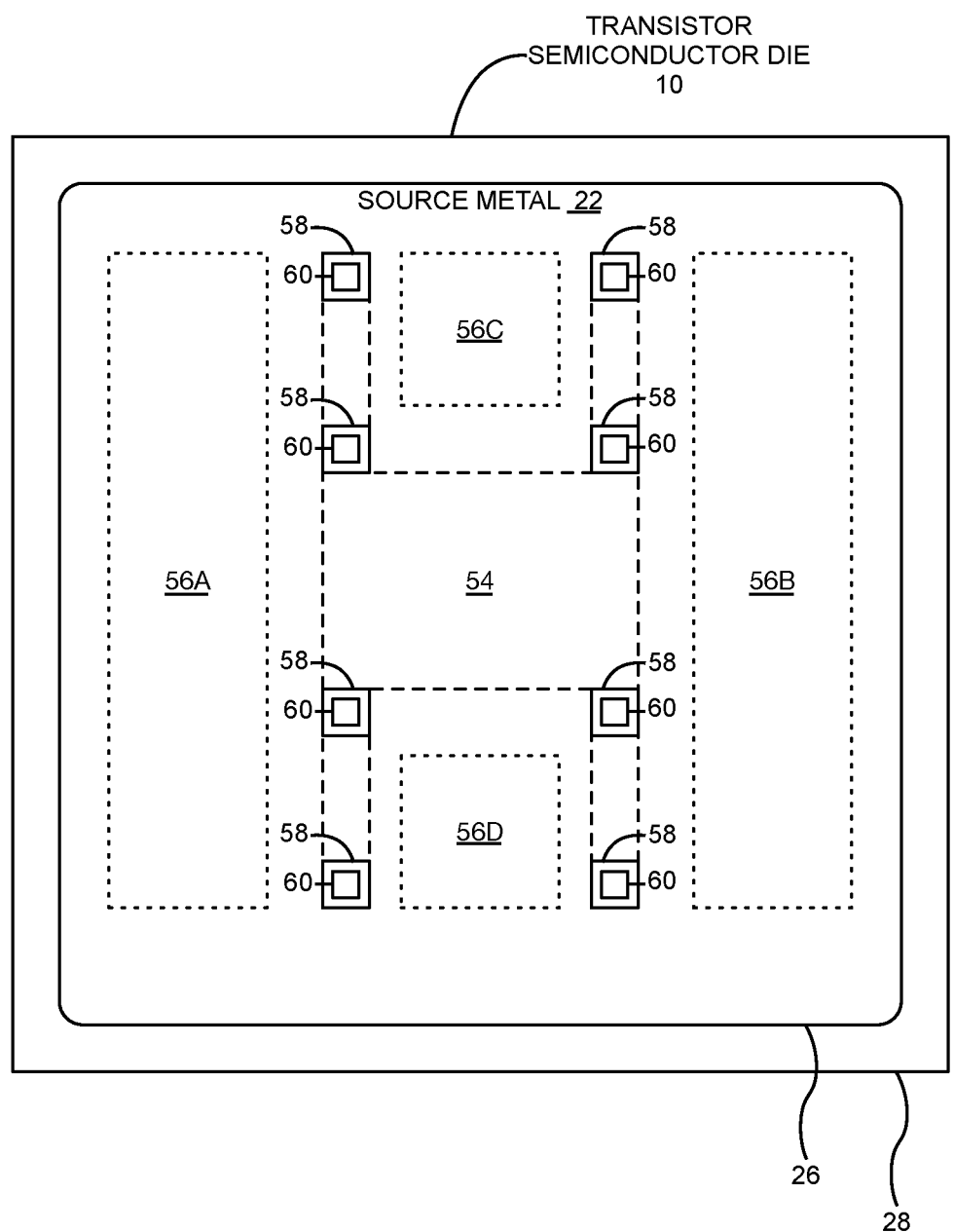
FIG. 11 is a top down view of a transistor semiconductor die according to one embodiment of the present disclosure.

As the size of the connection between the gate contact pad 14 and the underlying gate electrodes 40 decreases, a gate resistance of the transistor semiconductor die 10 may increase. Accordingly, the size and shape of the gate contact pad 14, the gate metal layer 18, and the number and placement of the gate contact vias 60 may be arranged to minimize a gate resistance of the transistor semiconductor die 10 while simultaneously maximizing an active portion of the device region 26 as illustrated in FIG. 10 and FIG. 11. In FIG. 10 and FIG. 11, the first dashed box 54 represents the placement of the gate metal layer 18 over the gate contact vias 60. The gate contact pad 14 may correspond with all or a subset of the gate metal layer 18 as discussed above. The second dashed box 56A and the third dashed box 56B once again represent the area of the source contact pads 16. In FIG. 11, a fourth dashed box 56C and a fifth dashed box 56D represent additional area of the source contact pads 16 that may be provided.

Figure 12:
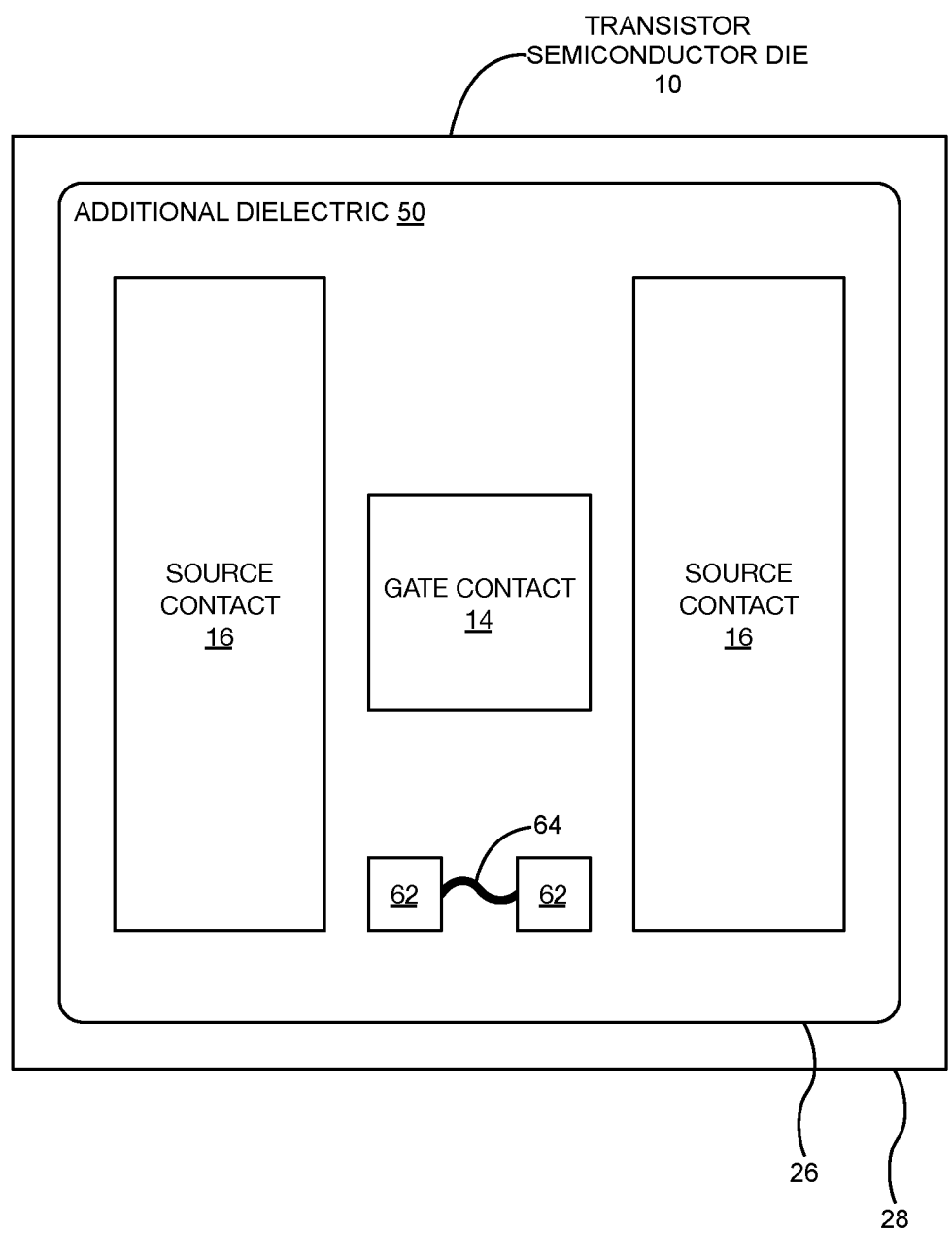
FIG. 12 is a top down view of a transistor semiconductor die according to one embodiment of the present disclosure.

In addition to maximizing the active portion of the device region 26 of the transistor semiconductor die 10, the additional dielectric layer 50 may also be used to provide additional features. Accordingly, FIG. 12 shows a top down view of the transistor semiconductor die 10 according to one embodiment of the present disclosure. Specifically, FIG. 12 shows the transistor semiconductor die 10 with the passivation layer 12 removed. Underneath the passivation layer 12 is the additional dielectric layer 50 through which the gate contact pad 14 and the source contact pads 16 are exposed. In addition to these contact pads, a number of sensor contact pads 62 are provided on the additional dielectric layer 50. The sensor contact pads 62 are coupled to a sensor 64, which may be any type of sensor, for example a temperature sensor, a strain sensor, or a current sensor. The sensor 64 may also be located on a surface of the additional dielectric layer 50 or may be located further down the layer stack such as on the dielectric layer 46, on the drift layer 36, or even in the drift layer 36. If the sensor 64 is located in the drift layer 36, it may detract from the total active area of the device region 26. However, the sensor 64 will generally be very small compared to the size of the device region 26 and thus having a sensor in the drift layer 36 may result in only a small reduction in the active area of the device region 26. Generally, the sensor contact pads 62 will be much larger than the sensor 64 itself, and since the sensor contact pads 62 are able to be located above the source metal layer 22, the active area of the device region 26 will be minimally impacted by the introduction of one or more sensors into the transistor semiconductor die 10. The sensor contact pads 62 may be formed by the same metallization layer as the gate metal layer 18 (i.e., in the same metallization step) in some embodiments.

Figure 13:
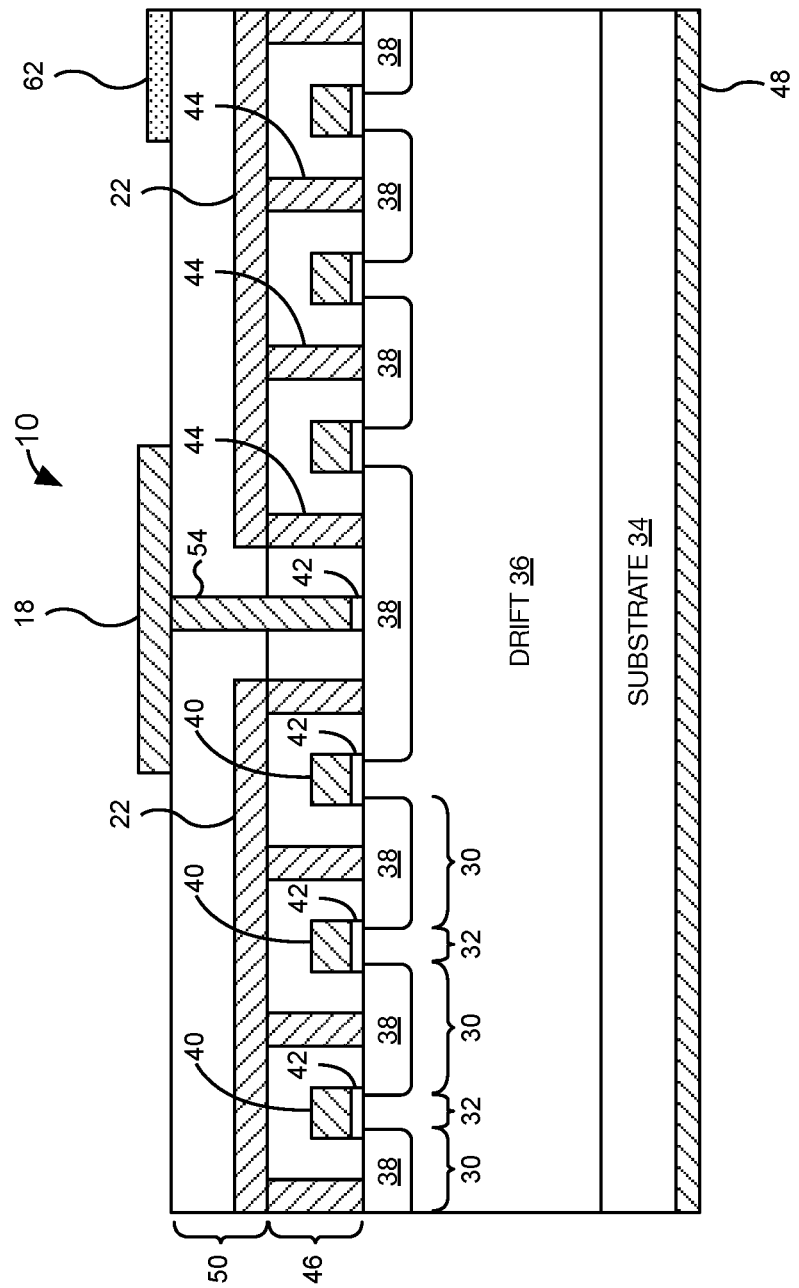
FIG. 13 is a cross-sectional view of a transistor semiconductor die according to one embodiment of the present disclosure.

FIG. 13 shows a cross-sectional view of the transistor semiconductor die 10 according to one embodiment of the present disclosure. The transistor semiconductor die 10 shown in FIG. 13 is substantially similar to that shown in FIG. 6, except that the sensor contact pad 62 is shown on the surface of the additional dielectric layer 50. The sensor 64 is not shown in FIG. 13, as the sensor 64 may be located behind the sensor contact pad 62 on the additional dielectric layer 50.

Figure 14:
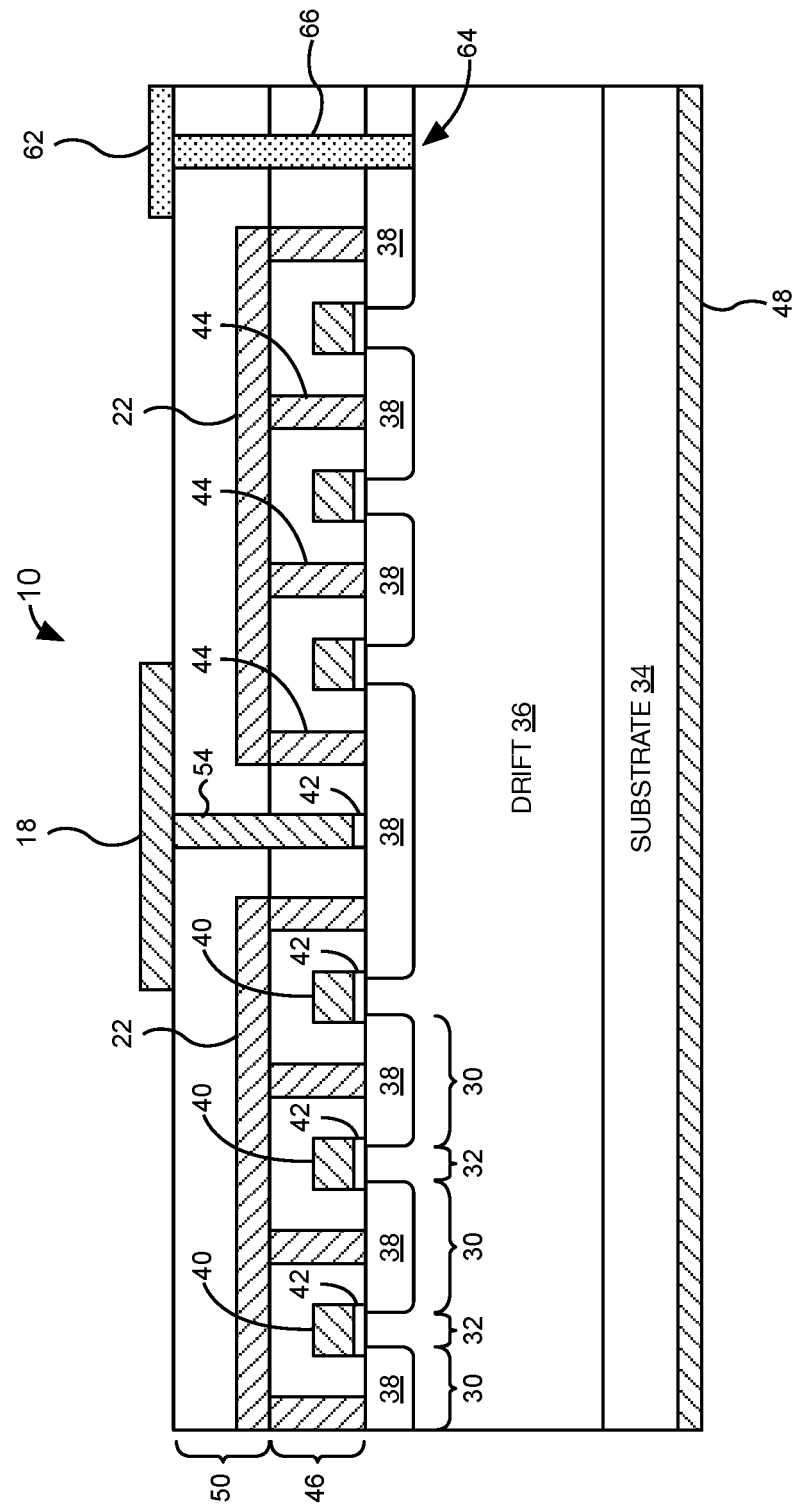
FIG. 14 is a cross-sectional view of a transistor semiconductor die according to one embodiment of the present disclosure.

FIG. 14 shows a cross-sectional view of the transistor semiconductor die 10 according to an additional embodiment of the present disclosure. The transistor semiconductor die 10 shown in FIG. 14 is substantially similar to that shown in FIG. 13, except that the sensor contact pad 62 is coupled to a sensor 64 located in the drift layer 36 by a sensor contact via 66. The sensor 64 may comprise one or more implanted regions in the drift layer 36 such that the sensor 64 can be any type of semiconductor device. The sensor 64 may be used to measure temperature, strain, current, voltage, or any other desired parameter. As discussed above, the sensor contact pad 62 generally requires a larger amount of area to implement than the sensor 64 and the sensor contact via 66. Providing the sensor contact pad 62 on the additional dielectric layer 50 such that the sensor contact pad 62 at least partially overlaps the source metal layer 22 thus reduces the impact of providing the sensor 64 in the transistor semiconductor die 10 on the active area of the device region 26 thereof. While the sensor 64 is shown in the drift layer 36, the sensor 64 may be located anywhere above or below the drift layer 36 and coupled to using any number of vias and intervening metal layers without departing from the principles of the present disclosure.

Figure 15:
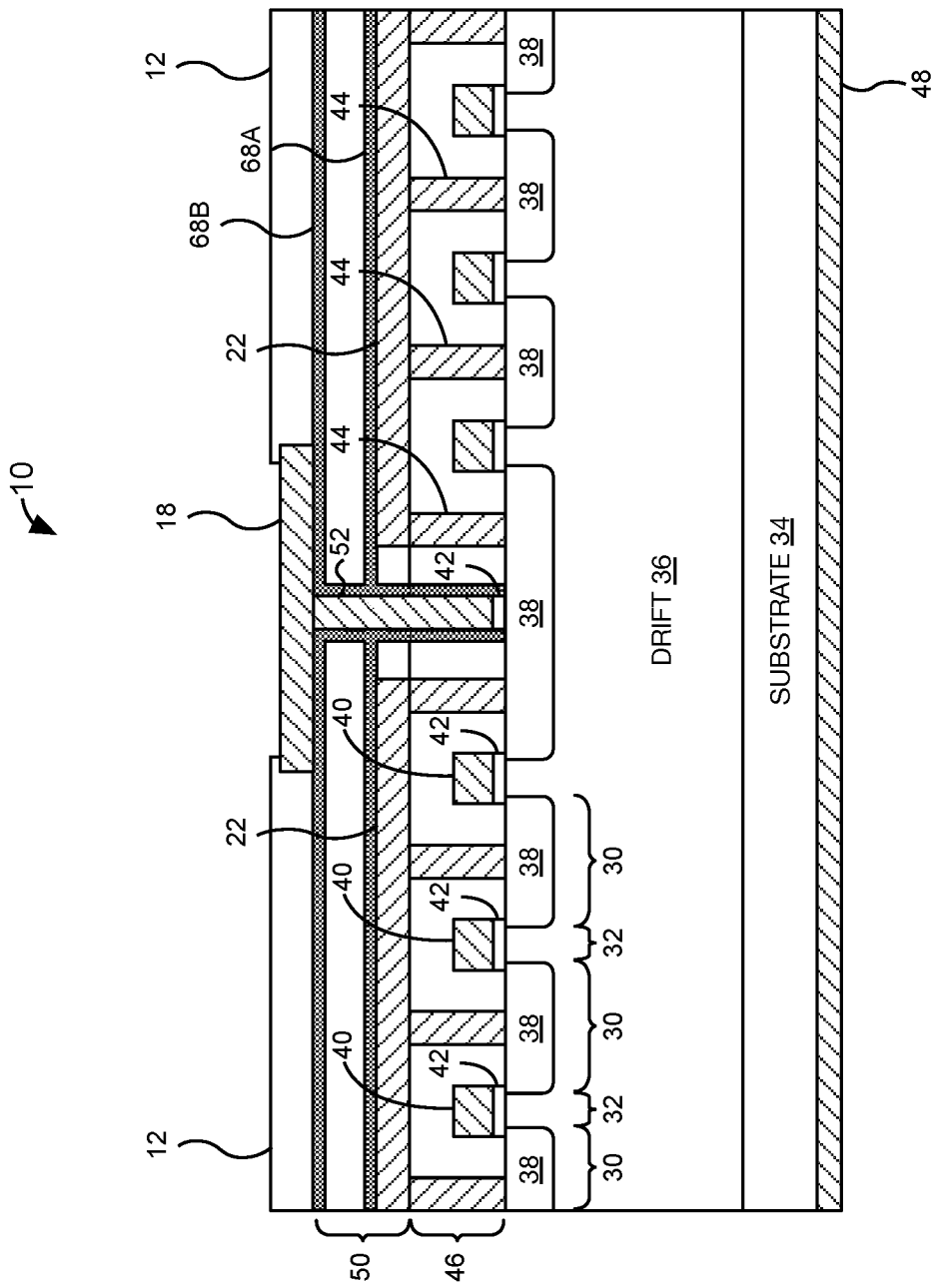
FIG. 15 is a cross-sectional view of a transistor semiconductor die according to one embodiment of the present disclosure.

FIG. 15 shows a cross-sectional view of the transistor semiconductor die 10 according to an additional embodiment of the present disclosure. The transistor semiconductor die 10 is substantially similar to that shown in FIG. 6 except that it further includes a first intervening layer 68A between the dielectric layer 46 and the additional dielectric layer 50 and a second intervening layer 68B between the additional dielectric layer 50 and the gate metal layer 18. The first intervening layer 68A and the second intervening layer 68B may reduce chemical interactions between the dielectric layer 46, the additional dielectric layer 50, the gate metal layer 18, and the source metal layer 22. This is important because the additional dielectric layer 50 may require a densification anneal for good dielectric properties. The first intervening layer 68A and the second intervening layer 68B may comprise $Si_3N_4$, $Al_2O_3$, AlN, $SiO_2$, varying layers of the same, or any other suitable materials. As discussed above, the dielectric layer 46 and the additional dielectric layer 50 may comprise $SiO_2$ or any other suitable materials. As shown, the second intervening layer 68B may be provided after an opening for the one or more vias 52 has been made. Accordingly, the second intervening layer 68B may be provided along the edges of the one or more vias 52 such that the second intervening layer 68B reduces chemical interactions between the metal of the one or more vias 52, the dielectric layer 46, and the additional dielectric layer 50. The one or more vias 52 may comprise a single conducting metal that is the same or different as the gate metal layer 18, or may comprise a stack of different metals as needed for forming a chemical or diffusion barrier layer along the walls of the one or more vias 52.

FIG. 15 also shows the passivation layer 12 over the gate metal layer 18. The passivation layer 12 may protect the transistor semiconductor die 10 from the surrounding environment. The passivation layer 12 may comprise $Si_2N_4$, $Al_2O_3$, $SiO_2$, alternating layers of the same, or any other suitable materials.

The transistor semiconductor die 10 may be a power semiconductor die configured to conduct at least 0.5 A in a forward conduction mode of operation and block at least 100 V in a blocking mode of operation. In various embodiments, the transistor semiconductor die 10 may be configured to conduct at least 1.0 A, at least 2.0 A, at least 3.0 A, at least 4.0 A, at least 5.0 A, at least 6.0 A, at least 7.0 A, at least 8.0 A, at least 9.0 A, and at least 10.0 A in the forward conduction mode of operation. The transistor semiconductor die 10 may be configured to block at least 250 V, at least 500 V, at least 750 V, at least 1 kV, at least 1.5 kV, and at least 2.0 kV in the blocking mode of operation.

Those skilled in the art will recognize improvements and modifications to the preferred embodiments of the present disclosure. All such improvements and modifications are considered within the scope of the concepts disclosed herein and the claims that follow.

What is claimed is:
1. A transistor semiconductor die comprising:
a drift layer;
a first dielectric layer on the drift layer;
a first metallization layer on the first dielectric layer, wherein at least a portion of the first metallization layer provides a first contact pad;
a second dielectric layer on the first metallization layer;
a second metallization layer on the second dielectric layer such that at least a portion of the second metallization layer provides a second contact pad;
a first plurality of electrodes electrically coupled to the first metallization layer and covered by the first dielectric layer;
a second plurality of electrodes electrically coupled to the second metallization layer such that the transistor semiconductor die is configured to selectively conduct current between the first contact pad and a third contact pad based on signals provided at the second contact pad;
an edge termination region; and
a device region, wherein a total inactive area within the device region is less than an area of the second contact pad.
2. The transistor semiconductor die of claim 1 wherein the transistor semiconductor die is configured to conduct more than 0.5 A between the first contact pad and the third contact pad in a forward conduction mode of operation and block more than 100 V between the first contact pad and the third contact pad in a blocking mode of operation.

3. The transistor semiconductor die of claim 1 wherein the drift layer comprises silicon carbide.

4. The transistor semiconductor die of claim 1 further comprising a passivation layer over the second metallization layer such that the first contact pad and the second contact pad are exposed through the passivation layer.

5. The transistor semiconductor die of claim 1 wherein the transistor semiconductor die is a metal-oxide-semiconductor field-effect transistor (MOSFET).

6. The transistor semiconductor die of claim 1 wherein the transistor semiconductor die is an insulated gate bipolar transistor (IGBT).

7. The transistor semiconductor die of claim 1 wherein the transistor semiconductor die provides a vertical transistor device such that the third contact pad is opposite the drift layer from the first contact pad and the second contact pad.

8. The transistor semiconductor die of claim 1 wherein the second metallization layer is coupled to the second plurality of electrodes by one or more vias through the first dielectric layer and the second dielectric layer.

9. The transistor semiconductor die of claim 1 further comprising one or more sensor contact pads on the second dielectric layer.

10. The transistor semiconductor die of claim 9 wherein the one or more sensor contact pads are coupled to a sensor on the second dielectric layer.

11. The transistor semiconductor die of claim 10 wherein the sensor is one or more of a temperature sensor, a strain sensor, and a current sensor.

12. The transistor semiconductor die of claim 9 wherein the one or more sensor contact pads are coupled to a sensor in the drift layer by one or more vias through the first dielectric layer and the second dielectric layer.

13. The transistor semiconductor die of claim 12 wherein the sensor is one or more of a temperature sensor, a strain sensor, and a current sensor.

14. The transistor semiconductor die of claim 9 wherein at least a portion of the one or more sensor contact pads overlaps the first metallization layer.

15. The transistor semiconductor die of claim 9 wherein an area of the first contact pad is at least 0.4 mm$^2$.

16. The transistor semiconductor die of claim 1 wherein at least a portion of the second metallization layer overlaps the first metallization layer.

17. The transistor semiconductor die of claim 1 wherein the first dielectric layer and the second dielectric layer comprise one or more of $SiO_2$, $al_2O_3$, and $Si_3N_4$.

18. The transistor semiconductor die of claim 17 wherein the first dielectric layer has a different composition than the second dielectric layer.

19. The transistor semiconductor die of claim 1 further comprising an intervening layer between the first dielectric layer and the second dielectric layer such that the intervening layer is between the first metallization layer and the second dielectric layer.

20. The transistor semiconductor die of claim 19 wherein:
the first dielectric layer, the second dielectric layer, and the intervening layer comprise one or more of $SiO_2$, $Al_2O_3$, and $Si_3N_4$; and
the intervening layer has a different composition than the first dielectric layer and the second dielectric layer.

21. The transistor semiconductor die of claim 19 further comprising an additional intervening layer between the second dielectric layer and the second metallization layer.

22. The transistor semiconductor die of claim 21 wherein:
the first dielectric layer, the second dielectric layer, the intervening layer, and the additional intervening layer comprise one or more of $SiO_2$, $Al_2O_3$, and $Si_3N_4$; and
the intervening layer and the additional intervening layer have a different composition than the first dielectric layer and the second dielectric layer.

23. The transistor semiconductor die of claim 1 wherein the transistor semiconductor die is a vertical transistor device.

24. A transistor semiconductor die comprising:
a drift layer;
a first dielectric layer on the drift layer;
a first metallization layer on the first dielectric layer, wherein at least a portion of the first metallization layer provides a first contact pad;
a second dielectric layer on the first metallization layer;
a second metallization layer on the second dielectric layer such that at least a portion of the second metallization layer provides a second contact pad;
a first plurality of electrodes electrically coupled to the first metallization layer and covered by the first dielectric layer;
a second plurality of electrodes electrically coupled to the second metallization layer; and
one or more sensor contact pads on the second dielectric layer.

25. The transistor semiconductor die of claim 24, wherein the transistor semiconductor die is configured to selectively conduct current between the first contact pad and a third contact pad based on signals provided at the second contact pad.

26. The transistor semiconductor die of claim 24 wherein the one or more sensor contact pads are coupled to a sensor on the second dielectric layer.

27. The transistor semiconductor die of claim 26 wherein the sensor is one or more of a temperature sensor, a strain sensor, and a current sensor.

28. The transistor semiconductor die of claim 24 wherein the one or more sensor contact pads are coupled to a sensor in the drift layer by one or more vias through the first dielectric layer and the second dielectric layer.

29. The transistor semiconductor die of claim 28 wherein the sensor is one or more of a temperature sensor, a strain sensor, and a current sensor.

30. The transistor semiconductor die of claim 24 wherein at least a portion of the one or more sensor contact pads overlaps the first metallization layer.

31. A transistor semiconductor die comprising:
a drift layer;
a first dielectric layer on the drift layer;
a first metallization layer on the first dielectric layer, wherein at least a portion of the first metallization layer provides a first contact pad;
a second dielectric layer on the first metallization layer;
a second metallization layer on the second dielectric layer such that at least a portion of the second metallization layer provides a second contact pad;
a first plurality of electrodes electrically coupled to the first metallization layer and covered by the first dielectric layer;
a second plurality of electrodes electrically coupled to the second metallization layer; and
an intervening layer between the first dielectric layer and the second dielectric layer such that the intervening layer is between the first metallization layer and the second dielectric layer.

32. The transistor semiconductor die of claim 31, wherein the transistor semiconductor die is configured to selectively conduct current between the first contact pad and a third contact pad based on signals provided at the second contact pad.

33. The transistor semiconductor die of claim 31 wherein:
- the first dielectric layer, the second dielectric layer, and the intervening layer comprise one or more of $SiO_2$, $Al_2O_3$, and $Si_3N_4$; and
- the intervening layer has a different composition than the first dielectric layer and the second dielectric layer.

34. The transistor semiconductor die of claim 31 further comprising an additional intervening layer between the second dielectric layer and the second metallization layer.

35. The transistor semiconductor die of claim 34 wherein:
- the first dielectric layer, the second dielectric layer, the intervening layer, and the additional intervening layer comprise one or more of $SiO_2$, $Al_2O_3$, and $Si_3N_4$; and
- the intervening layer and the additional intervening layer have a different composition than the first dielectric layer and the second dielectric layer.

\* \* \* \* \*